United States Patent [19]
Huang et al.

[11] Patent Number: 6,078,234
[45] Date of Patent: Jun. 20, 2000

[54] HELIUM VESSEL FOR OPEN ARCHITECTURE MAGNETIC RESONANCE IMAGING SUPERCONDUCTING MAGNET

[75] Inventors: Xianrui Huang; John Scaturro, Jr.; Peter L. Sue, all of Florence, S.C.

[73] Assignee: General Electric Company, Milwaukee, Wis.

[21] Appl. No.: 09/112,613

[22] Filed: Jul. 9, 1998

[51] Int. Cl.[7] ..................................... H01F 1/00
[52] U.S. Cl. ...................... 335/216; 335/299; 324/319; 505/892
[58] Field of Search .................... 335/216, 296, 335/299; 505/892, 898, 899; 324/319–321

[56] References Cited

U.S. PATENT DOCUMENTS

| | | | |
|---|---|---|---|
| 4,622,824 | 11/1986 | Creedon | 62/55 |
| 5,237,300 | 8/1993 | Ige et al. | 335/299 |
| 5,291,169 | 3/1994 | Ige et al. | 335/216 |
| 5,448,214 | 9/1995 | Laskaris | 335/301 |
| 5,696,476 | 12/1997 | Havens et al. | 335/216 |
| 5,874,880 | 2/1999 | Laskaris et al. | 335/216 |
| 5,883,558 | 3/1999 | Laskaris et al. | 335/216 |

*Primary Examiner*—Lincoln Donovan
*Assistant Examiner*—Tuyen Nguyen
*Attorney, Agent, or Firm*—Irving M. Freedman; Christian G. Cabou; Phyllis Y. Price

[57] ABSTRACT

A superconducting magnet utilizing a pair of donut-shaped annular magnet assemblies including in each a cryogen pressure vessel with a non-magnetic cylindrical divider forming pairs of concentric chambers. Pairs of axial non-magnetic strut members spaced about the interior of the pressure vessel extend at an angle within the concentric chambers between the end flanges of each assembly to resist forces generated within and between the pair of magnet assemblies.

16 Claims, 2 Drawing Sheets

FIG_1

HELIUM VESSEL FOR OPEN ARCHITECTURE MAGNETIC RESONANCE IMAGING SUPERCONDUCTING MAGNET

BACKGROUND OF INVENTION

This invention relates to an open architecture superconducting magnet assembly for a magnetic resonance imager (hereinafter called "MRI"), and more particularly to a strengthened helium pressure vessel for use in MRI equipment.

As is well known, a superconducting magnet can be made superconducting by placing it in an extremely cold environment, such as by enclosing it in a cryostat or pressure vessel containing liquid helium or other cryogen. The extreme cold enables that the magnet coils to become superconducting, such that when a power source is initially connected to the coils to introduce a current flow though the coils, the current will continue to flow even after power is removed due to negligible coil resistance at superconducting temperatures, thereby maintaining a magnetic field. Superconducting magnets find wide application in the field of MRI.

Most MRI equipments utilize solenoidal magnets enclosed in a unitary cylindrical structure with a central bore opening for patient access. However, the patient is practically enclosed in the warm bore, which can induce claustrophobia in some patients. The desirability of utilizing an open architecture structure in which the patient is not essentially totally enclosed has long been recognized as a means of patient comfort and to enable interventional procedures by the surgeon or health care provider. Unfortunately, an open architecture structure of the type utilizing two spaced donut-type or cylindrical shaped annular coil assemblies to provide open space and a vertical or central patient access gap between the coil assemblies poses a number of technical problems and challenges. One problem and challenge is to provide a structure which will produce the very homogeneous magnetic imaging field required while adequately supporting the separated coil assemblies under the considerable electromagnetic forces and thermal forces encountered during operation. The electromagnetic forces include large axial magnetic forces between the subcoils within each donut coil assembly in addition to a very large axial net force between the two donuts. Such magnetic forces are balanced in the more conventional unitary symmetrical superconducting magnet assembly and act axially toward each other with the intervening solid connecting structure receiving and readily handling such forces which are basically in balance.

However, in the case of a separated pair of donut or annular magnet assemblies, the imbalanced axial magnetic forces of each donut acts directly on the helium pressure vessels including their end flanges resulting in high stresses and possible deformation of the vessels which degrades homogeneity of the resultant magnetic field and the quality of the imaging. This is particularly true in the case of desirable lightweight magnets including those used in portable MRI equipment where weight is a consideration leading to the desired use of lightweight metal pressure vessels.

The magnetic field in the imaging bore must be very homogeneous and temporally constant for accurate imaging. Even slight flexures of the helium vessels and/or their internal superconducting magnet coil wires alters the spatial distribution of current flow through the coils and homogeneity of the imaging magnetic field sufficiently to degrade the quality of images produced by the MRI imaging system.

There are a number of other problems, including problems of differential thermal expansion and contraction of materials, and of minimizing weight and cost. All of these overlapping and conflicting requirements must be satisfied for a practical and useful MRI superconducting magnet structure.

SUMMARY OF INVENTION

It is therefore desirable to provide an improved lightweight cryogen pressure vessel for a superconducting magnet in an open architecture MRI which can withstand the severe electromagnetic forces and thermal forces encountered during operation.

In accordance with the one form of the invention, an open architecture superconducting MRI magnet utilizes two separated annular superconducting magnet assemblies connected by axial spacers, each of which includes a main magnet coil providing a strong magnetic imaging field in the vertical patient access gap between the assemblies.

Each magnet assembly includes a cryogen pressure vessel with an internal cylinder dividing the pressure vessel into two annular chambers with a plurality of pairs of non-magnetic internal braces spaced about the axis of the magnet within the chambers and extending angularly between the axially separated end flange walls. There are up to 16 pairs of braces in each annular assembly which extend at an angle of +−60 degrees from the outside end flanges of each pressure vessel toward the opposite end flange and are equally spaced around the axis of each assembly.

BRIEF DESCRIPTION OF DRAWINGS

Referring to FIGS. 1 and 2, superconducting magnet assembly 10 includes a pair of torroidal or donut-shaped annular assemblies 1 and 2 separated by four axially extending stainless steel spacers 3 positioned around and parallel to axis 5 of substantially cylindrical central imaging bore 4. The overall structure provides substantial open space 11 between annular assemblies 1 and 2 which avoids enclosure of, and provides medical practitioner access to, the patient positioned on a patient support (not shown) positioned within central bore 4. Magnet assembly 10 is supported on 4 base members 6 positioned at each corner.

Figure 1:
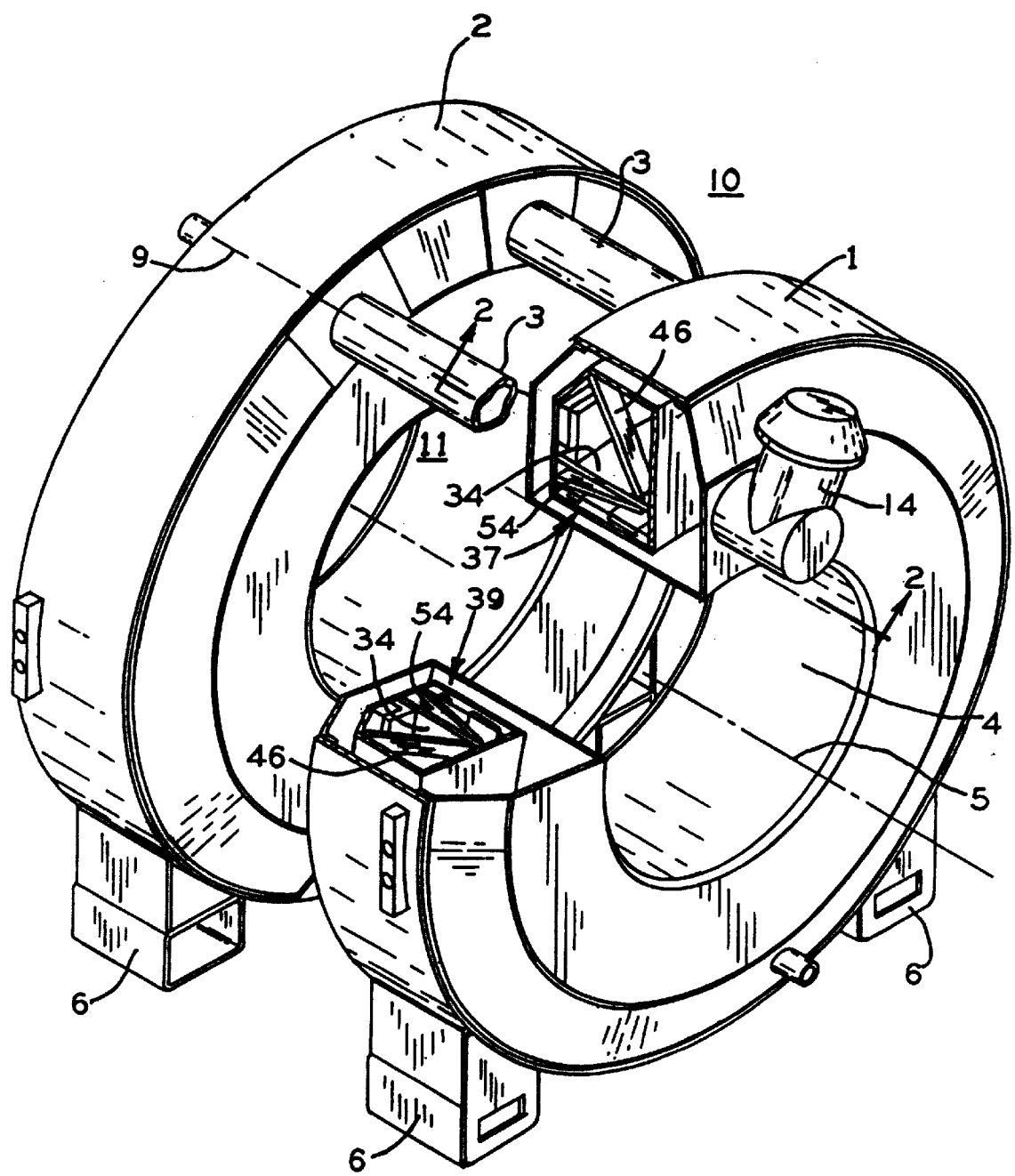
FIG. 1 is a perspective view of an MRI superconducting magnet shown partially cut away incorporating the present invention.
Figure 2:
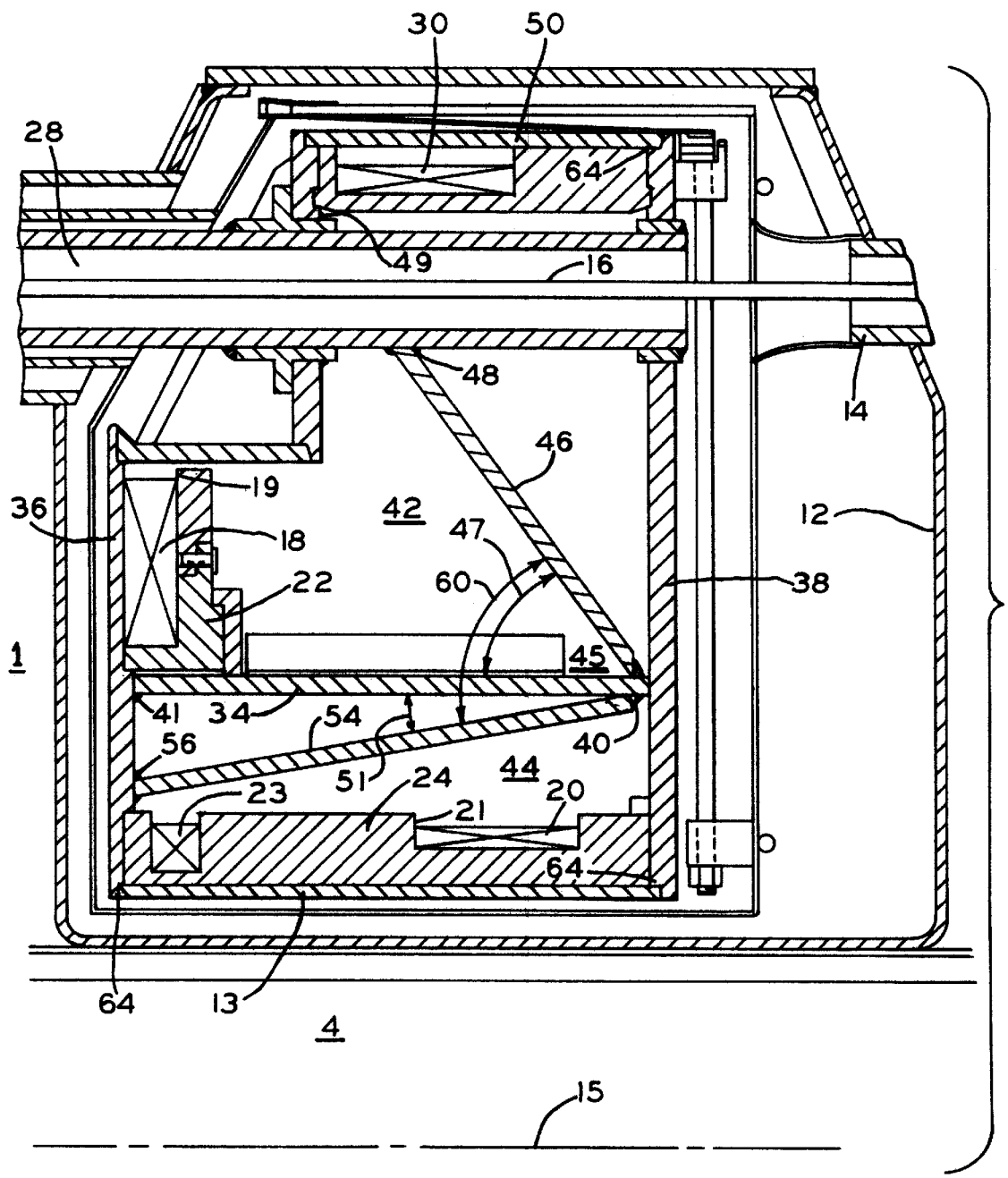
FIG. 2 is a cross section of a donut assembly of FIG. 1 taken along line 2—2 of FIG. 1 showing details of the present invention.

Each annular assembly 1 and 2 includes annular main magnet coils 18 and 20 and other auxiliary coils such as bucking coils 23 and 30 in helium vessel 13 which is positioned within vacuum vessel 12. Main magnet coils 18 and 20 and bucking coil 23 are wound in cavities or annular grooves 19 and 21, respectively, with rectangular cross section, on magnet coil forms 22 and 24, respectively.

Cooling is provided by cryocooler shown generally as 14 which provides cooling to the interior of helium pressure vessel 13 to cool main magnet coils 18, 20 and bucking coils 23 and 30 and related coils (not shown) to superconducting temperatures. Power to initially energize the coils 18, 20 is supplied by way of suitable electrical connections (not shown).

Bucking coils 23 and 30 are positioned remote from bore 4 to provide an active magnetic shield or magnet field which minimizes the effects of exterior magnet fields on superconducting magnet assembly 10 and also minimizes stray magnetic fields which might otherwise emanate from the magnet assembly to interfere with other electronic equipment such as other medical diagnostic equipment, proximate to the magnet assembly. It is noted that the width, or long dimension of main magnet coils 18 and 20 are substantially perpendicular and parallel, respectively, with axis 5.

Aluminum internal cylinder 34 extends perpendicularly between axially spaced parallel end walls or end flanges 36 and 38 of helium pressure vessel 13 substantially parallel to, and concentric about, axis 7 and is welded 40 and 41 along the periphery of its ends. Internal cylinder 34 divides the interior of helium pressure vessel 13 into two annular chambers 42 and 44. A first aluminum strut 46 extends from weld 40 within chamber 42 at an angle 47 of approximately 45 degrees to end region 49 proximate to the far or inside corner of end flange 36 thus substantially extending between end flanges 36 and 38.

A second aluminum strut 54 extends within chamber 44 between weld 40 adjacent end flange 38 to the central portion of inside end flange 36, at angle 51 in the range of 5–10 degrees forming angle 60 between struts 46 and 54 of approximately in the range of 50 to 65 degrees. Aluminum struts 46 and 54 are rectangular aluminum bars 3 inches in width and 0.5 inches in thickness. The use of aluminum not only helps in minimizing the weight of superconducting magnet assembly 10 but also are of non-magnetic material to avoid eddy current loading and interference with the magnetic fields developed by magnet coils 18, 20, 23 and 30. Aluminum internal cylinder 34 and aluminum struts 46 and 54 are secured within helium pressure vessel 13 prior to the welding of one of the end wall or end flange 36 or 38 to close the annular housings.

Struts 46 and 54 thus meet at juncture 45 and extend at an angle to, and between, end flanges 36 and 38 to resist deflections or deformations of pressure vessel 13 and the end flanges including deflection of the corners such as 64 by the compressive and expansive forces of the opposing magnetic fields generated by the interaction of the magnetic fields of magnet coils including 18, 20, 23 and 30 within, and between, assemblies 1 and 2.

The bracing and coil placement within coil assembly 2 is the mirror image of that of coil assembly 1, that is brace sets (not shown) equivalent to 46 and 54 meet at junctures such as 45 which are remote from the juncture 45 in housing 1, such that the junctures are on the opposite outside end flange walls of pressure vessels 13 of the coil assemblies.

There are 16 sets of angular struts 46 and 54 equally angularly spaced around axis 5 and the circumference of pressure vessel 13. FIG. 1 shows 2 pairs 37 and 39 of such struts.

Deflections or movement during superconducting operation of helium pressure vessel 13 could place stresses or deflections on the superconductors with which magnet coils 18, 20, 23 and 30 are wound, affecting the homogeneity of the resulting magnetic field of the patient imaging region within central bore 4 which would degrade superconducting magnet 10 MRI imaging performance. However, the subject construction counteracts and balances such potential deflections to avoid such undesired magnetic field inhomogeneities.

As a result, the present invention provides an open lightweight architecture MRI capable of withstanding the significant electromagnetic and thermal forces and loading encountered in use, while providing the necessary electrical, magnetic and structural characteristics. The open architecture design provides openings or open space 11 between assemblies 1 and 2 to minimize confinement of the patient, and enables interventional procedures by a physician while observing the MRI imaging of the patient in the region of the procedures.

While the present invention has been described with respect to certain preferred embodiments thereof, it is to be understood that numerous variations in the details of construction, the arrangement and combination of parts, and the type of materials used may be made without departing from the spirit and scope of the invention.

What is claimed is:

1. An open architecture magnetic resonance imaging superconducting magnet utilizing a separated pair of superconducting magnet coil assemblies forming an axial bore about the axis thereof and accessible open imaging volume between the superconducting magnet coil assemblies comprising:

a first annular magnet assembly housing positioned about said axis;

a second annular magnet assembly housing positioned about said axis, and spaced from said first annular magnet assembly;

each of the annular magnet assemblies including a cryogen pressure vessel and at least one superconducting magnet coil in each of said cryogen pressure vessel to provide a magnetic field within said open imaging volume;

an internal and strengthening assembly for each of said cryogen pressure vessels including a cylinder within the cryogen pressure vessel dividing said cryogen pressure vessel into two adjacent cylindrical chambers with end flanges closing the ends;

a plurality of braces internal to said adjacent cylindrical chambers extending around the interior of said pressure vessel between said end flanges at an angle to said axis; and said strengthening assembly resisting deformation of said cryogen pressure vessel by the magnetic forces generated by said at least one superconducting magnet coil.

2. The superconductin magnet of claim 1 wherein said magnetic forces include compression and expansion forces on said housing and said braces include pairs of braces with one brace of each pair within each of said pressure vessels with one end of each pair of braces being secured toward the same region of one of said end flanges to form and extend at an angle within said adjacent chambers to the opposite end flange with the apex of said angle positioned at said one of said end flanges.

3. The superconducting magnet of claim 2 wherein said one of said end flanges is the end flange axially remote from the region between said separated pair of superconducting magnet coil assemblies.

4. The superconducting magnet of claim 3 wherein said plurality of pairs of braces are spaced around said axis with one brace of each pair within each of said adjacent cylindrical chambers.

5. The superconducting magnet of claim 4 wherein there are 16 pairs of braces equally spaced about said axis and around the circumference of said chambers.

6. The superconducting magnet of claim 5 wherein one of said braces of said pairs of braces extends at a first angle in the range of 5–10 degrees to said internal cylinder.

7. The superconducting magnet of claim 6 wherein said pairs of braces which are at an angle to each other meet in the region of the intersection of said internal cylinder and said one of said end flanges with said internal cylinder dividing said apex of an angle into two additional angular supports.

8. The superconducting magnet of claim 7 wherein said second angle is in the range of 40 to 50 degrees.

9. The superconducting magnet of claim 7 wherein each of the braces of said pairs of braces extend between and intersect the opposite end flanges of the adjacent cylindrical chamber within which it is included.

10. The superconducting magnet of claim 4 including at least one superconducting magnet coil in each chamber.

11. The superconducting magnet of claim 10 wherein each superconducting magnet coil include a longer dimension which is at right angles to the longer dimension of the other superconducting magnet coil.

12. The superconducting magnet of claim 10 wherein a first bucking coil is included in at least one of said chambers, and a second bucking coil is positioned remote from said axis and said superconducting magnet coils to minimize interaction of magnetic fields generated external to said housings with the magnetic field in said imaging volume generated by said superconducting magnet coils.

13. The superconductin magnet of claim 12 wherein the longer dimension of a cross-section of said second bucking coil extends perpendicular to the longer dimension of a cross-section of the closest of one of said superconducting magnet coils.

14. The superconducting magnet of claim 4 wherein said braces are of non-magnetic material.

15. The superconducting magnet of claim 13 wherein said braces are rectangular aluminum bars.

16. The superconducting magnet of claim 12 wherein said aluminum bars have a cross section in the range of 0.5×3 inches.

* * * * *